(12) United States Patent
Matsumoto et al.

(10) Patent No.: US 7,526,399 B2
(45) Date of Patent: Apr. 28, 2009

(54) METHOD OF DELAY CALCULATION IN INTEGRATED CIRCUIT, AND TIMING ANALYSIS SYSTEM USING THE SAME

(75) Inventors: Junko Matsumoto, Kanagawa (JP); Tetsuya Akimoto, Kanagawa (JP)

(73) Assignee: NEC Corporation, Tokyo (JP)

( * ) Notice: Subject to any disclaimer, the term of this patent is extended or adjusted under 35 U.S.C. 154(b) by 686 days.

(21) Appl. No.: 10/931,047

(22) Filed: Sep. 1, 2004

(65) Prior Publication Data

US 2005/0050499 A1  Mar. 3, 2005

(30) Foreign Application Priority Data

Sep. 2, 2003 (JP) ............................. 2003-309872
Nov. 5, 2003 (JP) ............................. 2003-376266

(51) Int. Cl.
*G06F 9/45* (2006.01)

(52) U.S. Cl. ............................. 702/125; 702/89; 716/6

(58) Field of Classification Search ............... 702/79, 702/125, 57, 66, 69, 72, 89, 117; 716/6; 327/158, 250
See application file for complete search history.

(56) References Cited

U.S. PATENT DOCUMENTS

| 3,440,652 | A | * | 4/1969 | Bates et al. ................... 342/88 |
| 5,206,861 | A | * | 4/1993 | Hannon et al. ............... 714/731 |
| 5,309,371 | A | * | 5/1994 | Shikata et al. ................ 716/10 |
| 5,404,311 | A | * | 4/1995 | Isoda ............................ 716/6 |
| 6,353,916 | B1 | * | 3/2002 | Kuwayama .................... 716/6 |
| 6,507,936 | B2 | * | 1/2003 | Yamaguchi .................... 716/6 |
| 6,684,375 | B2 | | 1/2004 | Tsukiyama et al. |
| 7,051,314 | B2 | | 5/2006 | Goto |
| 2004/0254776 | A1 | | 12/2004 | Andou |

FOREIGN PATENT DOCUMENTS

| JP | 08-221456 | 8/1996 |
| JP | 9-311877 | 12/1997 |
| JP | 2002-279012 A | 9/2002 |
| JP | 2003-0196341 A | 7/2003 |
| WO | WO 03/060776 A1 | 7/2003 |

* cited by examiner

*Primary Examiner*—Manuel L Barbee
(74) *Attorney, Agent, or Firm*—Foley & Lardner LLP

(57) ABSTRACT

In a method of delay calculation of relative timing paths of an integrated circuit, each of the paths contains at least one stage. The method is achieved by calculating an on-chip variation depending on a systematic component and an on-chip variation depending on a random component; and by carrying out delay calculation of relative timing paths by using the on-chip variation depending on the systematic component and the on-chip variation depending on the random component.

24 Claims, 13 Drawing Sheets

Fig. 13

TIMING ANALYSIS LOG (a)

| | STAGE | DELAY TIME |
|---|---|---|
| SOURCE SIDE CLOCK PATH P1 | $P1_1$ | $TP1_1$ |
| | $P1_2$ | $TP1_2$ |
| | $P1_3$ | $TP1_3$ |
| | ⋮ | ⋮ |
| | $P1_n$ | $TP1_n$ |

(b)

| | STAGE | DELAY TIME |
|---|---|---|
| TARGET SIDE CLOCK PATH P2 | $P2_1$ | $TP2_1$ |
| | $P2_2$ | $TP2_2$ |
| | $P2_3$ | $TP2_3$ |
| | ⋮ | ⋮ |
| | $P2_n$ | $TP2_n$ |

HOLD ANALYSIS RESULT $$th \leq D_{min} - (\overbrace{TP1_{min}}^{(a)} - \overbrace{TP2_{max}}^{(b)})$$
$$th = 50\,ps \leq 20\,ps \rightarrow NG$$

METHOD OF DELAY CALCULATION IN INTEGRATED CIRCUIT, AND TIMING ANALYSIS SYSTEM USING THE SAME

BACKGROUND OF THE INVENTION

1. Field of the Invention

The present invention relates to a method of delay calculation in an integrated circuit and a timing analysis system using the same. More particularly, the present invention relates to a method of delay calculation in an integrated circuit, in which on-chip variation on a pair of paths is considered, and a timing analysis system using the same.

2. Description of the Related Art

Conventionally, when a delay time is calculated in case of timing verification (analysis) of an integrated circuit, a variation of delay time is calculated by multiplying a constant coefficient (delay time variation) with a delays time in paths from a branch, depending on a distribution of delay time. The constant coefficient (delay time variation) is obtained by adding a systematic component and a random component which are components of the delay time. The systematic component is defined as the maximum delay time under the consideration of one end to the other end in a chip, and the random component is calculated as a value per one stage on the path. The constant coefficient (delay time variation) is often not accurate.

FIG. 1 is a flow chart showing a conventional procedure of the timing analysis to an integrated circuit. Circuit data 100 of the integrated circuit (logic circuit) as a verification object is inputted and a delay time TP is calculated at each stage in a path (Step S801). The calculated delay time TP is stored as delay time data (Step S802).

Next, by multiplying a constant coefficient (delay time variation) with the calculated delay time, the delay time variation is calculated (Step S803), and stored as a delay time variation data (Step S804). Then, two paths logically related with each other are specified based on the circuit data 100 (Step S805), and the specified paths are stored as relative paths data (Step S806).

Next, the timing analysis of the SETUP analysis and the HOLD analysis to the relative paths is carried out using the variation of delay time (Step S807).

FIGS. 2 to 4 are diagrams to describe a conventional calculation method of the delay time in the paths of the integrated circuit. When there is not an on-chip variation between the paths, that is, the on-chip variation is '0' as shown in FIG. 2, the delay time TP1 of one path P1 is a summation of the delay times TP1 i of respective stages i.

As shown in FIGS. 3 and 4, when the on-chip variation is not '0', the delay time TP1 of the path P1 is a summation of the delay times $TP1_i$ in all thestages i on the path P1 in case of the minimum delay time ($-\alpha$) or the maximum delay time ($+\alpha$), as the minimum delay time $TP1_{min}$ or the maximum delay time $TP1_{max}$. The minimum delay time $TP1_{min}$ and the maximum delay time $TP1_{max}$ are calculated by using a constant coefficient ($\alpha$) as shown in the following equations (7).

$$TP1_{min} = \sum_{i=1}^{n} \{TP1_i * (1-\alpha)\} \quad (7)$$

$$TP1_{max} = \sum_{i=1}^{n} \{TP1_i * (1+\alpha)\}$$

For example, a conventional method of delay calculation is disclosed in Japanese Laid Open Patent Application (JP-A-Heisei 9-311877). In this conventional method, a maximum error which is set for every stage is multiplied with a calculated delay time for the stage to calculate the variation of delay time. This calculation method is the same as the above-mentioned method of multiplying the constant coefficient.

In this way, in the conventional delay time calculation method, the constant coefficient is multiplied to the delay time in the path from a branch. Therefore, it is not possible to carry out the calculation of the delay time with high accuracy to the pair of paths of a short distance and the paths with a large number of the stages. This is because the paths are not specified. For this reason, the stage count and the coordinate of each of the stages contained in the path cannot be specified, and the systematic component and the random component cannot be correctly calculated. Also, it is not possible to carry out an analysis with high reliability and the high accuracy in the integrated circuit timing analysis because the delay time with high accuracy cannot be obtained.

SUMMARY OF THE INVENTION

Therefore, an object of the present invention is to provide a delay calculation method which can precisely calculate a delay time variation generated due to an on-chip variation between two relative timing paths.

Also, another object of the present invention is to provide a timing analysis system in which a timing analysis with higher reliability and higher accuracy is possible by considering an on-chip variation between two relative timing paths.

In an aspect, the present invention is related to a method of delay calculation of relative timing paths of an integrated circuit, wherein each of the paths contains at least one stage. The method is achieved by calculating an on-chip variation depending on a systematic component and an on-chip variation depending on a random component; and by carrying out delay calculation of relative timing paths by using the on-chip variation depending on the systematic component and the on-chip variation depending on the random component.

Also, in another aspect of the present invention, a timing analysis system includes a delay calculation section which calculates a delay time at each of stages in relative timing paths based on circuit data of an integrated circuit; a path specifying section which extracts and specifies two of the paths of the integrated circuit; and a coordinate data extracting section which determines data of coordinates of the specified paths or a distance between the relative timing paths from layout data. The timing analysis system further contains a stage count extracting section which extracts a number of the stages in each of the specified paths; a delay time variation calculating section which calculates a systematic component and a random component of an on-chip variation of the delay time of each of the specified paths; and a timing analysis section which carries out timing analysis of SETUP and the HOLD based on the on-chip variation depending on the systematic component and the on-chip variation depending on the random component.

Also, in another aspect of the present invention, a timing analysis system includes a delay calculation section which calculates a delay time at each of stages in relative timing paths based on circuit data of an integrated circuit; a path specifying section which extracts and specifies two of the paths of the integrated circuit; a stage count extracting section which extracts a number of the stages in each of the specified paths; a delay time variation calculating section which calculates a random component of an on-chip variation of the delay time of each of the specified paths; and a timing analysis section which carries out timing analysis of SETUP and the HOLD based on the on-chip variation depending on the random component.

Also, in another aspect, the present invention relates to a computer-readable software product for realizing a method of delay calculation of relative timing paths of an integrated circuit, wherein each of the paths contains at least one stage. The method may be achieved by calculating an on-chip variation depending on a systematic component; by calculating the on-chip variation depending on a random component; and by carrying out delay calculation of relative timing paths by using the on-chip variation depending on the systematic component and the on-chip variation depending on the random component.

BRIEF DESCRIPTION OF THE DRAWINGS

The above and other objects, advantages and features of the present invention will be more apparent from the following description taken in conjunction with the accompanying drawings, in which:

FIG. 13 is a diagram showing a content example of a timing analysis log outputted in case of timing analysis shown in FIG. 12.

DESCRIPTION OF THE PREFERRED EMBODIMENTS

Hereinafter, a method of delay calculation and a timing analysis system using the same according to the present invention will be described in detail with reference to the attached drawings.

Figure 5:
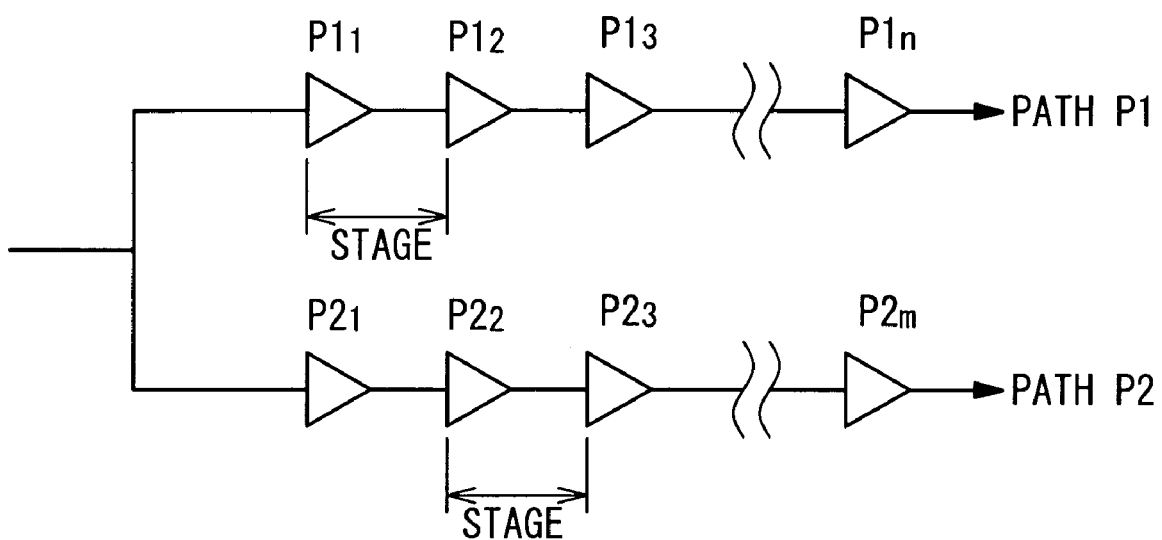
FIG. 5 is a diagram showing an example of two paths to which a delay calculation method of the present invention is applied.

First, the delay calculation method according to the first embodiment of the present invention will be described. FIG. 5 is a diagram showing an example of a pair of paths P1 and P2 in an integrated circuit. As shown in FIG. 5, the path P1 is composed of n stages (n is an integer equal to or more than 1) of stages P11 to P1n, each of which is composed of transistors. The path P2 is composed of m stages (m is an integer equal to or more than 1) of stages P21 to P2m. Here, the stage contains each of the stages P11 to P1n and P21 to P2m itself and an interconnect portion (an interconnect wiring) from the stage to the input of the stage of the next stage. Also, the stage P11 to P1n and P21 to P2m itself may be defined as a stage without considering the interconnect portion.

The description will be made, supposing that each stage in the paths P1 and P2 means one stage. Also, it is supposed that the delay time of the stage P1i ($1 \leq i \leq n$) as the i-th stage in the path P1 is TP1i and the delay time of the stage P2j ($1 \leq j \leq m$) as the j-th stage in the path p2 is TP2j.

In the present invention, an on-chip variation of the delay time in each path (delay time variation) is separated into a systematic component and a white Gaussian noise component (hereinafter, to be referred to as a random component). The delay time variation depending on the systematic component is calculated by using the coordinate of the stages in the pair of paths (distance between the stages) and a delay time of each stage. The delay time variation depending on the random component is calculated as a component having a normal distribution independent in each stage and dependent on the number of stages.

In the systematic component in the on-chip variation of the delay time, coordinates of the stages in a chip are considered. For example, the systematic component is determined as a function which depends on the distance L between two of the stages (for example, a multidimensional polynomial), and is expressed as VS(L). The function VS is determined based on actual measurement results of many samples.

The random component in the on-chip variation is expressed as a predetermined constant VR determined for every stage.

The delay time variations (RTSn and RTSm) which depend on the systematic component are expressed in the following equation set (1). In the equation set (1), it is supposed that the distances between the stages in the paths are LP1n-P2j and LP2m-P1i. Here, the delay time variation depending on the systematic components at the n-th stage in the path P1 and the m-th stage in the path P2 are calculated.

$$RTS_n = \sum_{j=1}^{m} TP2_j * VS(L_{p1n-p2j}) \Big/ \sum_{j=1}^{m} TP2_j \qquad (1)$$

$$RTS_m = \sum_{i=1}^{n} TP1_i * VS(L_{p2m-p1i}) \Big/ \sum_{i=1}^{n} TP1_i$$

The calculation of the above equation set (1) is carried out for every stage on each path to find a delay time variation depending on the systematic component.

The delay time variation (RTR) depending on the random component is calculated as follows.

Figure 3:
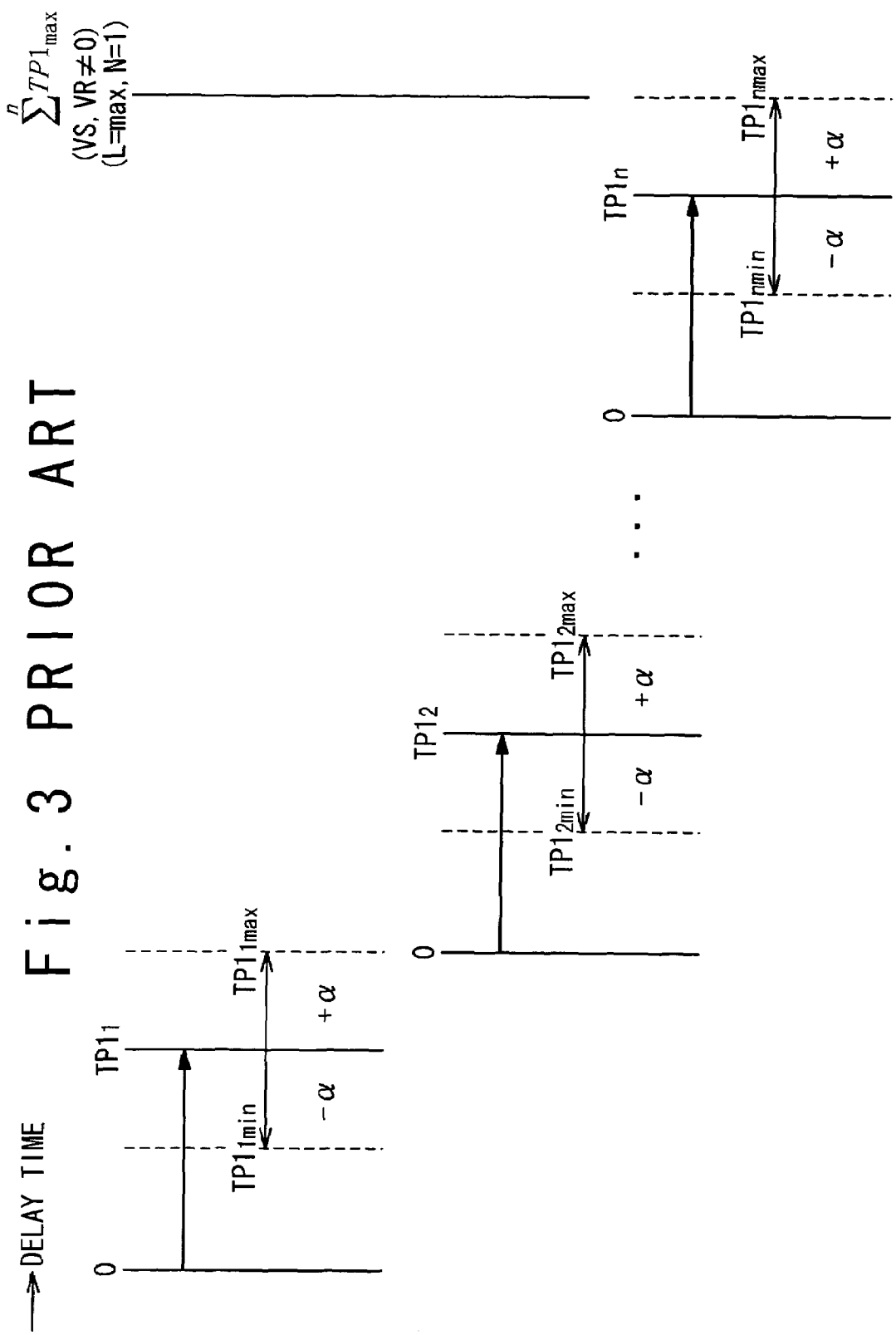
FIG. 3 is a diagram showing another conventional delay time calculation example when there is an on-chip variation in the path.
Figure 4:
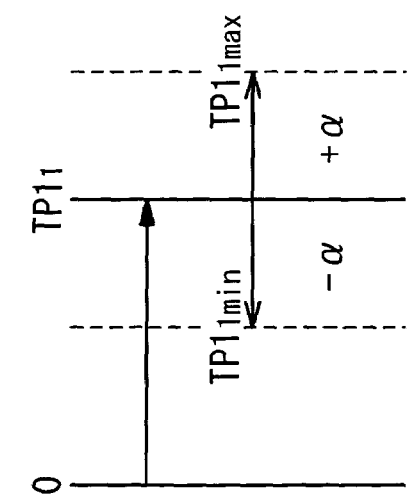
FIG. 4 is a diagram showing another conventional delay time calculation example when there is an on-chip variation in the path.
Figure 4:
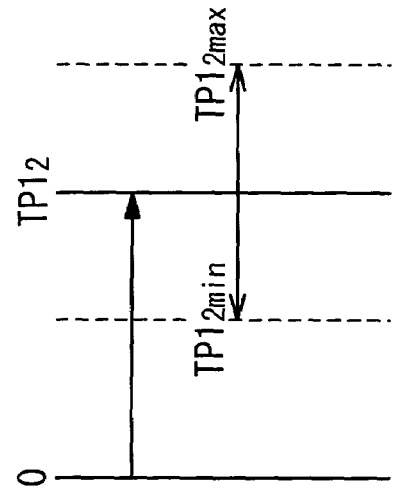
Figure 4:
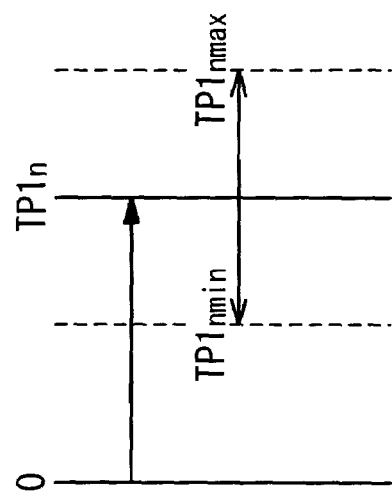

In FIG. 3, the delay time of each stage is calculated in case of $TP1_1 = TP1_2 = \ldots = TP1_n$ and the maximum delay time $TP1_{max}$ of the path is calculated from the following equation (a).

$$TP1_{max} = n \cdot TP1_1 + n \cdot \alpha \cdot TP1_1 \qquad (a)$$

Here, because the constant VR is thought of as a variance summation, the following equation (b) stands up.

$$TP1'_{max} = n \cdot TP1_1 + \sqrt{n \cdot \alpha^2} \cdot TP1_1 \qquad (b)$$
$$= n \cdot TP1_1 + \sqrt{n} \cdot \alpha \cdot TP1_1$$

The second components of the equations (a) and (b) on the right side show the calculation of delay time variation.

Supposing that a reference delay time is the maximum delay time $TP1_{max}$ of the path, an average calculation of delay time variation per one stage under the consideration of the random component is expressed by the following equation (c).

$$n \cdot \alpha \cdot TP1_1 / \sqrt{n} \cdot \alpha \cdot TP1_1 = \frac{n}{\sqrt{n}} \qquad (c)$$

In the equation (c), if $\alpha^*TP1_1 = VR$, the following equation (2-1) is obtained.

$$RTR_n = n \cdot \alpha \cdot TP1_1 = VR/\sqrt{n}$$
$$RTR_m = m \cdot \alpha \cdot TP2_1 = VR/\sqrt{m} \qquad (2\text{-}1)$$

Also, if the reference delay time is TP1 (=TP1 1+ TP1 2+ ... +TP1 n), the increment of the average delay time per one stage under the consideration of the random component is expressed by the following equation set (2-2) from the equation (b) and $\alpha^*TP11=VR$.

$$RTR_n = \sqrt{n} \cdot VR$$
$$RTR_m = \sqrt{m} \cdot VR \qquad (2\text{-}2)$$

The above equation set (2-1) or equation set (2-2) is calculated for every stage on each path to find the delay time variation depending on the random component. Which of the equation (2-1) and equation (2-2) should be used depends on whether the reference delay time is the maximum delay time $TP1_{max}$ or TP1.

The delay time under the consideration of the delay time variation depending on the Systematic component and the delay time variation depending on the random component as the on-chip variation is calculated from the following equation set (3) as the delay time variation (RTS) depending on the systematic component and the delay time variation (RTR) depending on the random component, which are calculated as mentioned above.

$$TP1_{min}(L, n) = \sum_{i=1}^{n} \left\{ TP1_i * \left( 1 - \sqrt{(RTS_i)^2 + (RTR_i)^2} \right) \right\} \qquad (3)$$
$$TP1_{max}(L, n) = \sum_{i=1}^{n} \left\{ TP1_i * \left( 1 + \sqrt{(RTS_i)^2 + (RTR_i)^2} \right) \right\}$$
$$TP2_{min}(L, m) = \sum_{j=1}^{m} \left\{ TP2_j * \left( 1 - \sqrt{(RTS_j)^2 + (RTR_j)^2} \right) \right\}$$
$$TP2_{max}(L, m) = \sum_{j=1}^{m} \left\{ TP2_j * \left( 1 + \sqrt{(RTS_j)^2 + (RTR_j)^2} \right) \right\}$$

In this way, it is possible to precisely calculate the delay time generated from the on-chip variation between two relative timing paths.

Figure 6:
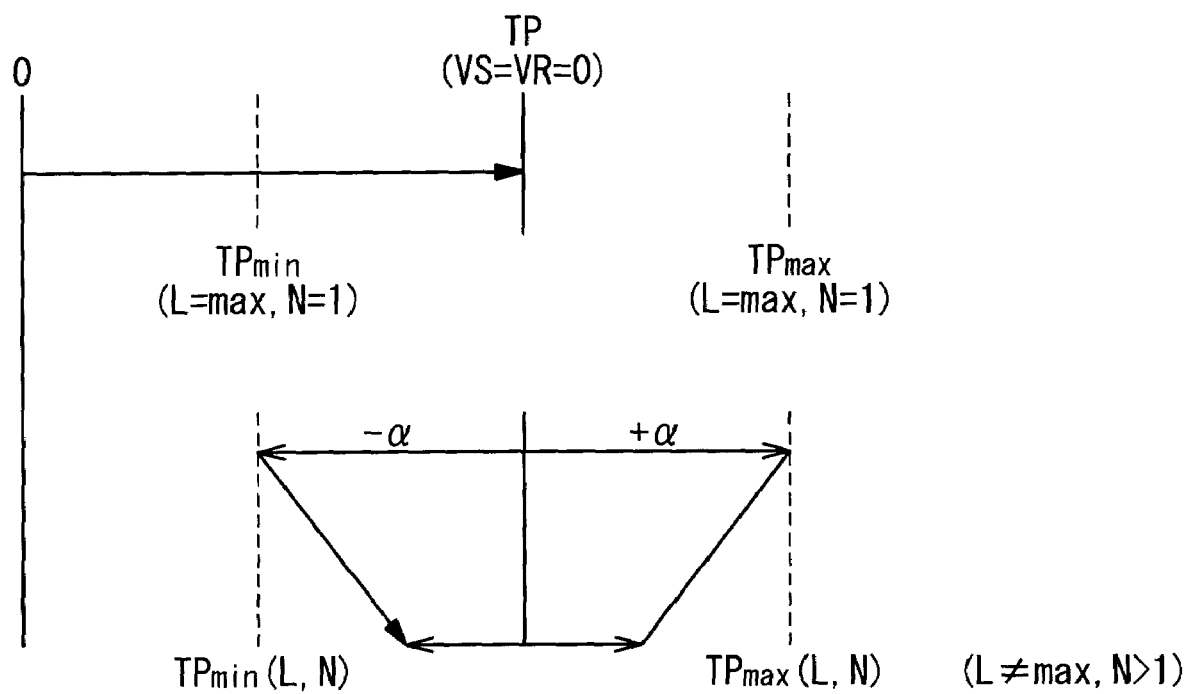
FIG. 6 is a diagram showing an example of a delay time calculation result by the delay calculation method of the present invention.

FIG. 6 shows an example of the calculation result of the delay time under the consideration of the on-chip variation. The distance is L=max and the number of the stages is N=1, considering VS(L) and VR(N) in case of the worst delay. As shown in FIG. 6, in the delay time calculation results from the equation set (3), the calculation result in case of L≠max and N>1 is always inside the calculation result in case of L=max and N=1. Therefore, any overestimation can be avoided.

Figure 7:
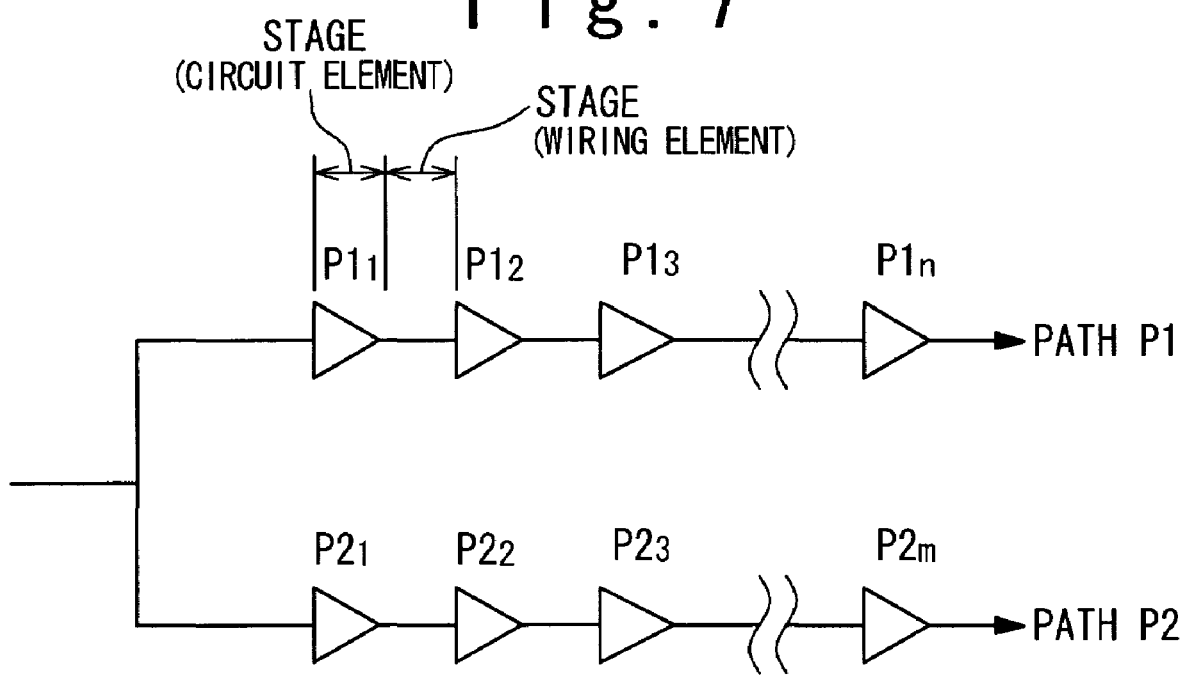
FIG. 7 is a diagram showing another example of a pair of paths to which the delay calculation method of the present invention is applied.

It should be noted that in the above description, the case is described in which the delay time is calculated, supposing that one stage contains each of the stages of P11 to P1n and P21 to P2m shown in FIG. 5 and an interconnect portion (interconnect wiring) to the input of the stage of the next stage. However, as shown in FIG. 7, if the stage is divided into a stage and an interconnect wiring and the delay time is calculated from the above equation sets (1)-(3) under the consideration of the on-chip variation (delay time variation) of the delay time, the calculation of the higher accuracy becomes possible under the consideration of the interconnect wiring.

Figure 8:
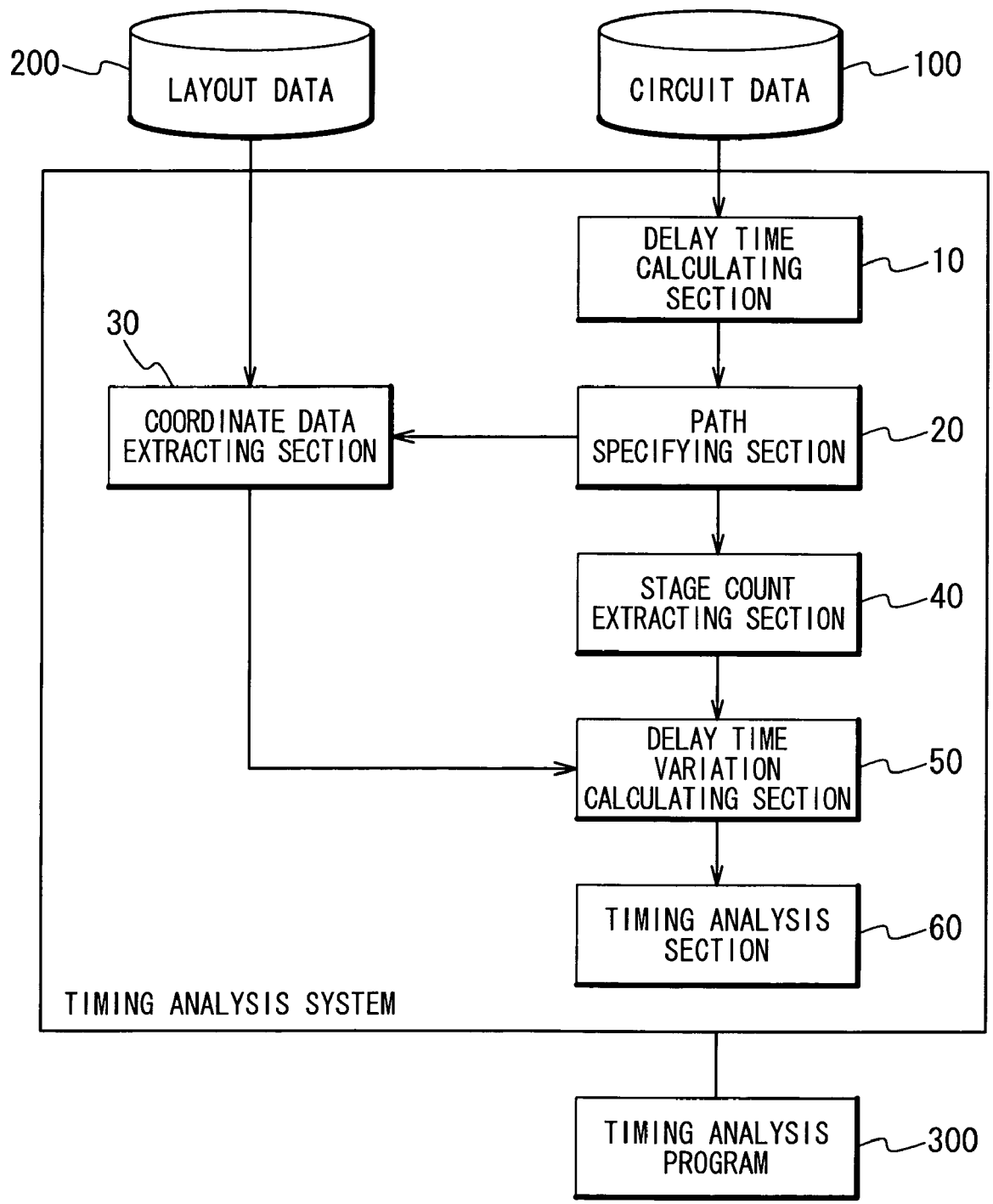
FIG. 8 is a block diagram showing a timing analysis system according to an embodiment of the present invention.

Referring to FIG. 8, a timing analysis system to which the delay calculation method of the present invention is applied will be described.

As shown in FIG. 8, the timing analysis system according to this embodiment is composed of a delay calculation section 10, a path specifying section 20, a coordinate data extracting section 30, a stage count extracting section 40, a delay time variation calculating section 50, and a timing analysis section 60.

The delay calculation section 10 inputs circuit data 100 of an integrated circuit (logic circuit) as a test object and calculates a delay time at each stage in each path.

The path specifying section 20 extracts and specifies the paths of the integrated circuit to which the timing analysis should be carried out.

The coordinate data extracting section 30 extracts data of coordinates of the specified paths from layout data 200. Specifically, the coordinate data extracting section 30 extracts data of a distance between the paths.

The stage count extracting section 40 extracts the number of the stages which are contained in each of the specified paths. Here, the stage may contain only stages itself composed of transistors or contains each of the stages and an interconnect portion (interconnect wiring) to the input of the stage of the next stage.

The delay time variation calculating section 50 separates an on-chip variation of the delay time of the path into a systematic component and a white Gaussian noise component (hereinafter, to be referred to as a random component) and calculates them.

The timing analysis section 60 carries out the timing analysis of SETUP and the HOLD based on the delay time under the consideration of the specified paths.

Each section of the timing analysis system in this embodiment may be configured in hardware. Instead, each section of the timing analysis system may be configured in software by a CPU loading a timing analysis program 300 (an application program) which contains a delay time calculation program and executing the timing analysis program 300. This timing analysis program (the delay time calculation program) 300 is stored in a recording medium such as a semiconductor memory and a magnetic recording medium, and is loaded on the CPU from the recording medium. Thus, the operation of the CPU is controlled and each function necessary for the timing analysis of the delay time calculation is realized.

Figure 9:
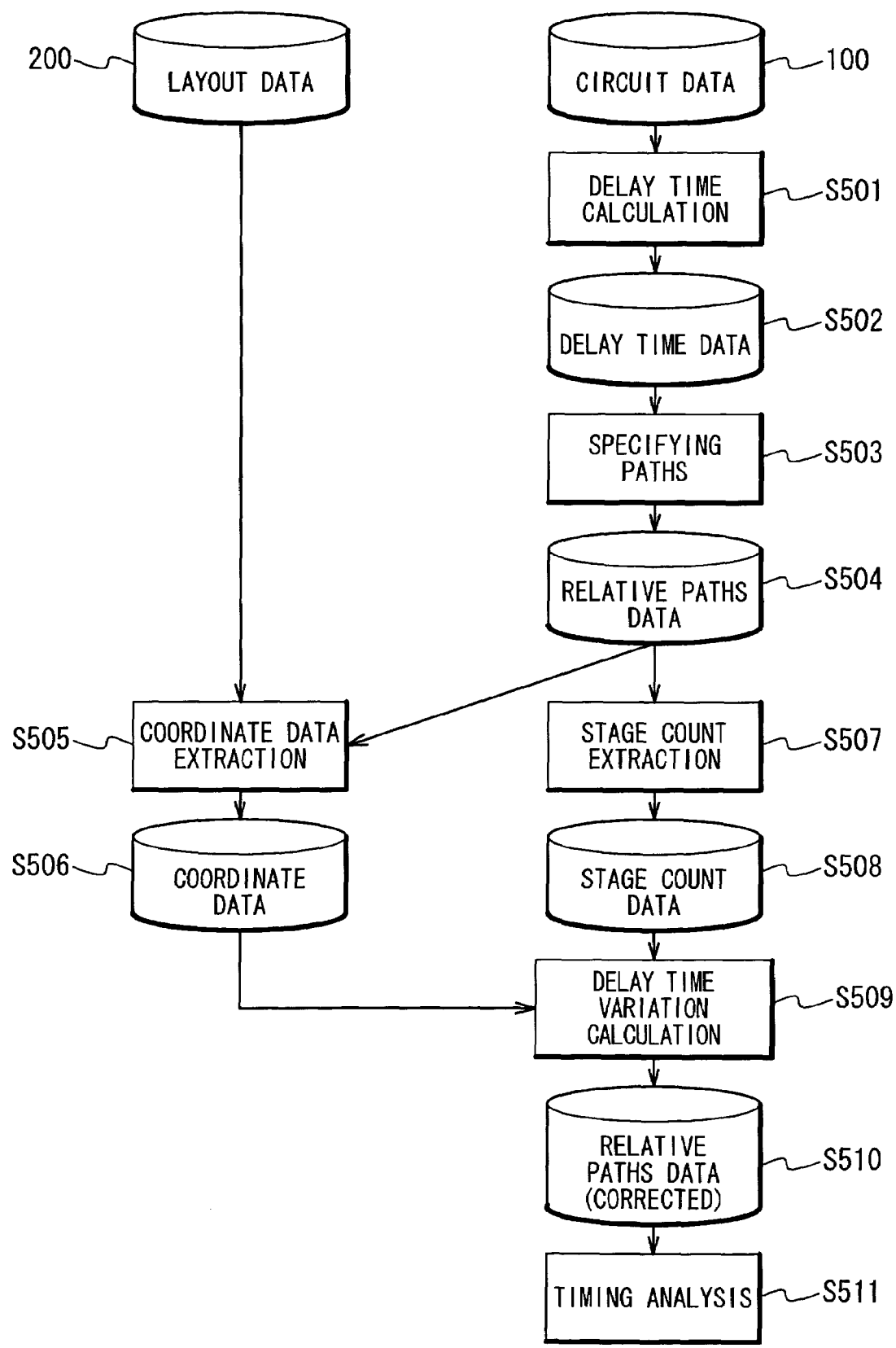
FIG. 9 is a flow chart showing an operation of the timing analysis system according to the first embodiment of the present invention.

FIG. 9 is a flow chart showing the operation of the timing analysis system of this embodiment.

The delay calculation section 10 inputs circuit data 100 of the integrated circuit (logic circuit) as a test object and calculates a delay time TP in each stage in each of the paths (Step S501). Then, the delay calculation section 10 stores the calculated delay time TP as the delay time data (Step S502).

Next, the path specifying section 20 specifies two paths which are logically related to each other, from the circuit data 100 (Step S503). The path specifying section 20 stores the specified paths as relative paths data (Step S504).

Figure 10:
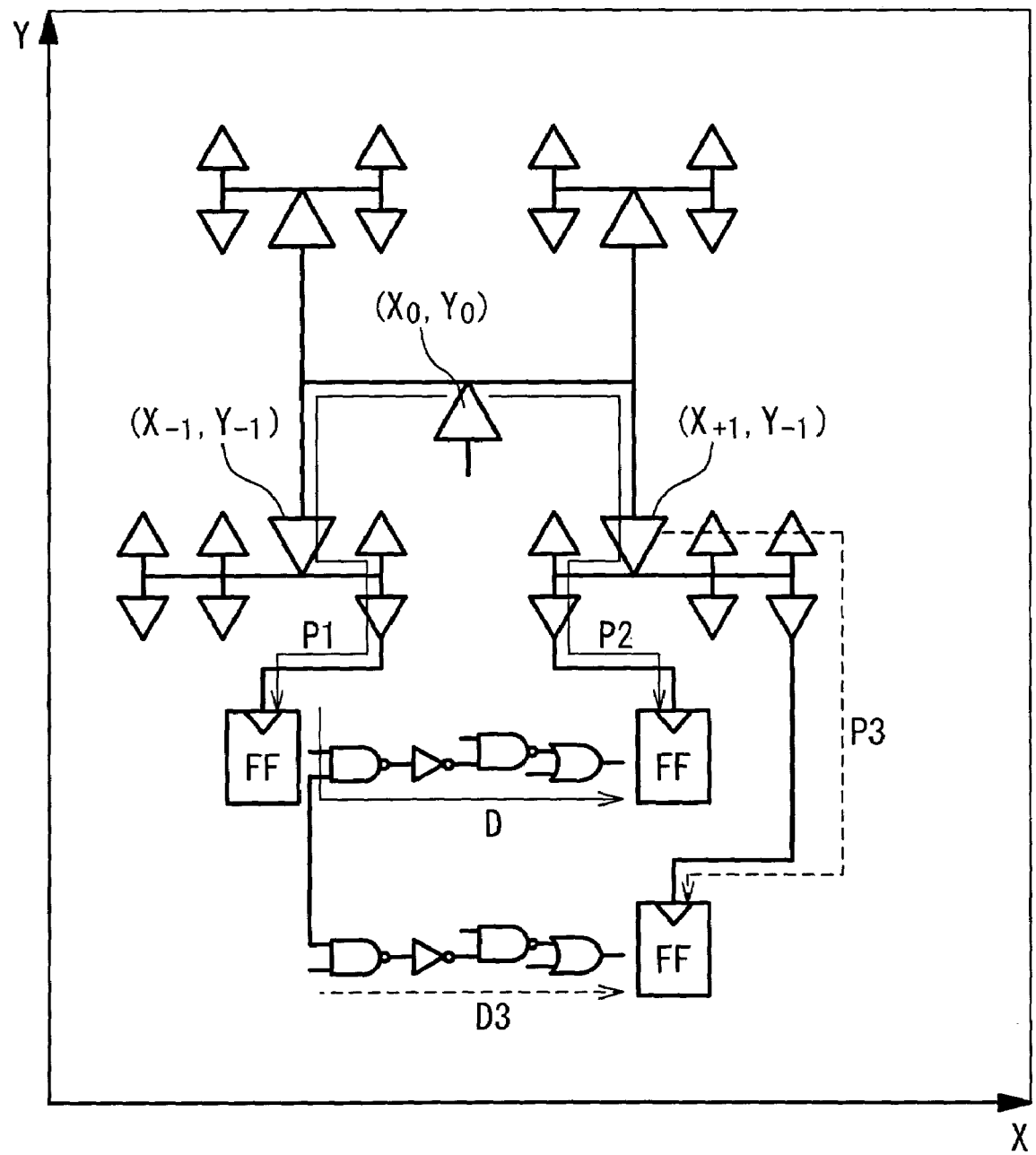
FIG. 10 is a diagram showing an example of layout data used in the delay time calculation method of the present invention.

The coordinate data extracting section 30 extracts the coordinate data of each of the stages on the specified paths in a chip based on the layout data 200 and the relative path data of the integrated circuit, as shown in FIG. 10. Also, the coordinate data extracting section 30 finds the distance between the stages contained in the specified paths (Step S505), and stores as coordinate data (Step S506).

The stage count extracting section 40 extracts the number of the stages contained in each of the specified paths based on the relative path data (Step S507). Then, the stage count extracting section 40 stores as a stage count data (Step S508).

The delay time variation calculating section 50 refers to the coordinate data and the stage count data for the specified paths indicated by the relative path data to calculate distances. Thus, the delay time variation calculating section 50 calculates the delay time under the consideration of the delay time variation depending on the systematic component and the delay time variation depending on the random component from the above mentioned equation sets (1) to (3) by using the referred data and calculated data (Step S509). Then, the delay time variation calculating section 50 stores the calculated delay time as a relative paths data (Step S510).

Lastly, the timing analysis section 60 carries out the timing analysis of the SETUP analysis and the HOLD analysis to the specified paths based on the relative delay data (Step S511).

It should be noted that in FIG. 9, the extracting process of the coordinate data and the storage process at the steps S505 and S506 may be omitted. In addition, only the delay time may be calculated under the consideration of only the delay time variation depending on the random component in the calculating process of the delay time at the step S509. In this case, because the delay time variation depending on the systematic component is not considered, the accuracy decreases but the structure and processes of the timing analysis system can be made simple.

Figure 11:
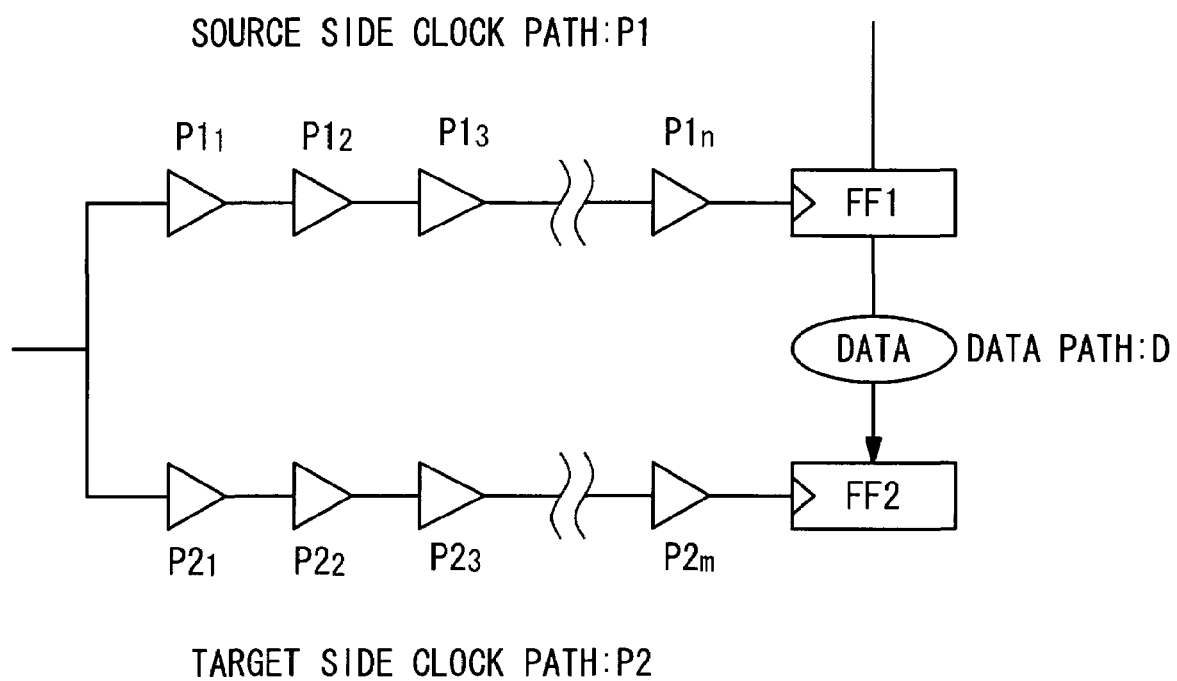
FIG. 11 is a diagram showing a method of timing analysis to which a calculation result of the delay calculation method of the present invention is applied.

The timing analysis system using the delay calculation method of the present invention will be described below. In this example, the SETUP analysis and the HOLD analysis of the paths in the structure shown in FIG. 11 will be described. The paths for which the SETUP analysis and the HOLD analysis are carried out contain a clock path P1 on the side of a source, and a clock path P2 on the side of the sink, and sequential circuits FF1 and FF2, as shown in FIG. 11.

(1) SETUP Analysis

The SETUP analysis is carried out by using the maximum delay time to the clock path P1 on the source side and the data path D and by using the minimum delay time to the clock path P2 on the sink side. In the SETUP analysis, it is confirmed that the following equation (4) is satisfied, when the cycle time is Tc and the SETUP time of the sequential circuit is ts.

$$\text{Dmax} + (TP1_{max}(L,n) - TP2_{min}(L,m)) + ts \leq Tc \qquad (4)$$

where $TP1_{max}$, $TP1_{min}$, $TP2_{max}$, and $TP2_{min}$ in the equation (4) are the delay times calculated by using the equation set (3).

(2) HOLD Analysis

On the other hand, the HOLD analysis is carried out by using the minimum delay time to the clock path P1 on the source side and the data path D and the maximum delay time to the clock path P2 on the sink side. In the HOLD analysis, it is confirmed that the following equation (5) is satisfied, when the HOLD time of the sequential circuit is th.

$$th \leq \text{Dmin} - (TP1_{min}(L,n) - TP2_{max}(L,m)) \qquad (5)$$

By carrying out the above timing analysis using the delay time with the good accuracy under the consideration of the on-chip variation, the analysis with the higher reliability and the higher accuracy is possible, compared with a case that the delay time is multiplied by a coefficient as in the conventional example.

Next, another example of the timing analysis using the delay calculation method of the present invention will be described below. In this example, the timing analysis is carried out in accordance with the conventional procedure shown in FIG. 1, and a delay time calculated by the delay calculation method of the present invention is applied to the timing analysis result for correction. Thus, the verification is carried out.

Figure 1:
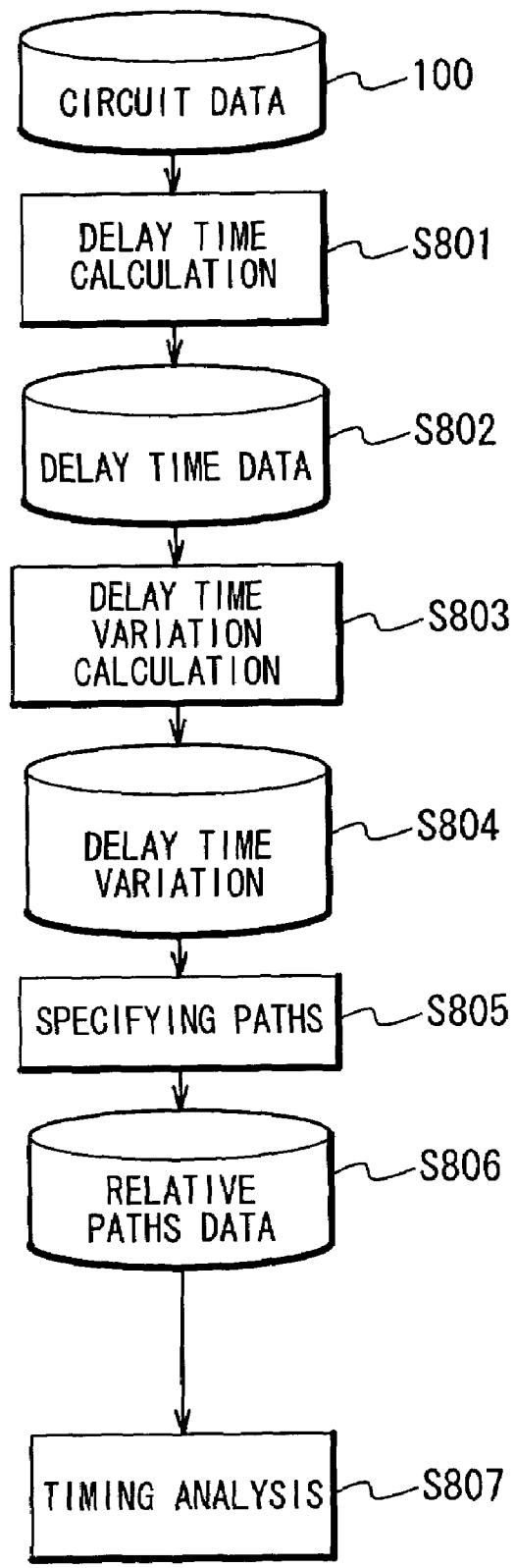
FIG. 1 is a flow chart showing an operation of conventional timing analysis to an integrated circuit.
Figure 2:
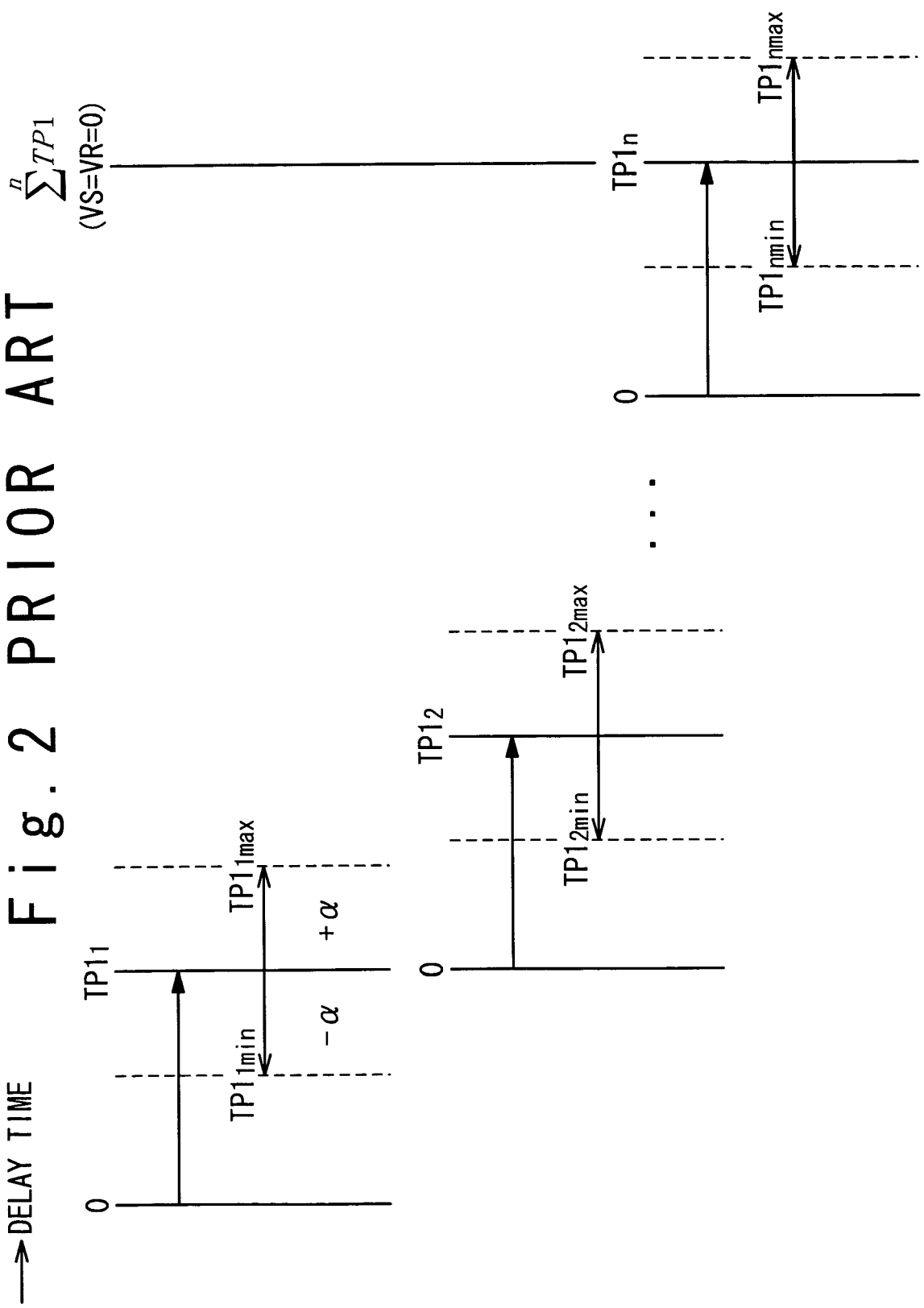
FIG. 2 is a diagram showing a conventional delay time calculation example when there is no on-chip variation in a path.
Figure 12:
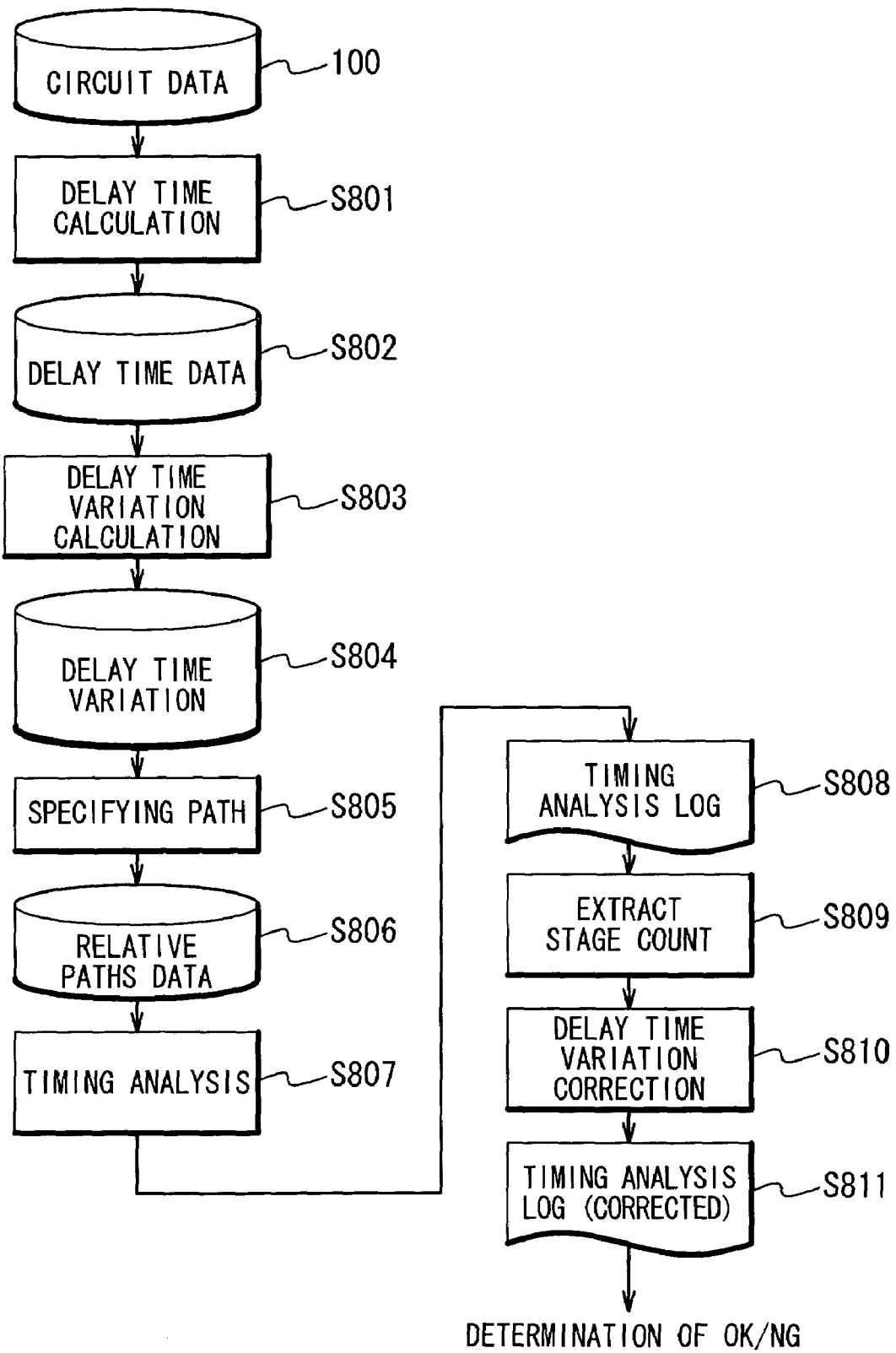
FIG. 12 is a diagram showing another example of the timing analysis using the delay calculation method of the present invention.

In FIG. 12, the same processes as in the conventional timing analysis of the steps S801 to S807 shown in FIG. 1 are carried out at steps S801 to S807 in FIG. 12. Therefore, the description is omitted.

At the S807 step, when the timing analysis of the SETUP analysis and the HOLD analysis of the paths is carried out by using the variation of delay time, an analysis log of the timing analysis is outputted (Step S808). FIG. 13 shows an example of the timing analysis log in the HOLD analysis to the paths of the structure shown in FIG. 11. In FIG. 13, (a) shows a delay time for every stage in the source side clock path P1 and (b) shows a delay time for every stage in the sink side path P2.

Also, an HOLD analysis result is shown. The HOLD time th is "50 ps", "Dmin-(TP1min-TP2max)" is "20 ps" and a result (NG) is shown that the equation (5) is not satisfied.

In the timing analysis log, when the analysis result (NG) that the equations (4) or (5) is not satisfied is shown in the SETUP analysis result or the HOLD analysis result, the stage count of the paths for which analysis result (NG) is shown is extracted (step S809). Also, a correction of the delay time calculation at the step 801 is carried out by using the following equation set (6) of the delay time under the consideration of only the delay time variation depending on the random component, and by using the equation set (2-1) or (2-2) to find the delay time variation depending on the random component to the paths (Step S810).

$$TP1_{\min}(L, n) = \sum_{i=1}^{n} \left\{ TP1_i * \left(1 - \sqrt{(RTR_i)^2}\right) \right\} \qquad (6)$$

$$TP1_{\max}(L, n) = \sum_{i=1}^{n} \left\{ TP1_i * \left(1 + \sqrt{(RTR_i)^2}\right) \right\}$$

$$TP2_{\min}(L, m) = \sum_{i=1}^{m} \left\{ TP2_j * \left(1 - \sqrt{(RTR_j)^2}\right) \right\}$$

$$TP2_{\max}(L, m) = \sum_{j=1}^{m} \left\{ TP2_j * \left(1 + \sqrt{(RTR_j)^2}\right) \right\}$$

In case of the example of FIG. 13, the components of the delay time $TP1_{min}$ of the source side path P1 and the delay time $TP2_{max}$ of the sink side path P2 are corrected by using the equation set (6) of the delay time under the consideration of only the delay time variation depending on the random component.

Whether the equations (4) or (5) are satisfied is calculated once again by using the delay time after the correction, and the result is outputted as the timing analysis log after the correction (Step S811). For example, in the example of FIG. 13, when ($TP1_{min}$-$TP2_{max}$) is "50 ps" by carrying out the correction to the delay time under the consideration of the delay time variation depending on the random component, the analysis result that the equation (5) is satisfied is outputted as the timing analysis log after the correction.

As described above, when the SETUP analysis result and the HOLD analysis result do not satisfy the equations (4) and (5) in the timing analysis log without calculating the delay time under the previous consideration of the on-chip variation, the correction to the delay time is carried out under the consideration of the delay time variation depending on the random component and the check is carried out once again. Therefore, although the analysis accuracy is inferior, compared with a case that the delay time variation depending on the systematic component and the random component are considered, the timing analysis system can be simply realized.

As described above, according to the delay calculation method of the present invention, the delay difference caused based on the on-chip variation between two relative timing paths can be precisely calculated.

Also, by specifying two paths logically related to each other, the coordinate data of the stage contained in each path in the chip and the number of the stages in the path can be found. A distance between the stages can be found by obtaining the coordinate data, and the equation (1) can be applied to the path delay time calculation. The equation set (2-1) or (2-2) can be applied to the path delay time calculation by obtaining the number of the stages. Therefore, by obtaining the coordinate data and the number of the stages in the path, the systematic component and the random component can be correctly calculated because the equation (3) can be applied.

The present invention was described above by using the embodiments or examples, but the present invention is not always limited to the above embodiments or examples. The present invention is possible to implement various modifications within the spirit of the present invention.

What is claimed is:

1. A method of delay calculation of relative timing paths of an integrated circuit, said method comprising:

calculating an on-chip variation depending on a systematic component and an on-chip variation depending on a random component, wherein said on-chip variation depending on said systematic component is based on a distance between two stages on said relative timing paths and a delay time of each of said stages and said on-chip variation depending on said systematic component is calculated from the following equation set (1);

$$RTS_n = \sum_{j=1}^{m} TP2_j * VS(L_{p1n-p2j}) \Big/ \sum_{j=1}^{m} TP2_j \qquad (1)$$

$$RTS_m = \sum_{i=1}^{n} TP1_i * VS(L_{p2m-p1i}) \Big/ \sum_{i=1}^{n} TP1_i$$

where said relative timing paths contains a first path and a second path, said first path contains n stages, said second path contains m stages, $TP1_n$ is a delay time of the n-th stage in said first path, $TP2_m$ is a delay time of the m-th stage in said second path, $VS(L_{p1n-p2m})$ is the systematic component at the n-th stage in said first path, $L_{p1n-p2m}$ is a distance between the n-th stage in said first path and the m-th stage in said second path, $VS(L_{p2m-p1n})$ is a systematic component of the m-th stage in said second path, $L_{p2m-p1n}$ is a distance between the m-th stage in said second path and the n-th stage in said first path, $RTS_n$ is an on-chip variation depending on the systematic component in said first path, and $RTS_m$ is an on-chip variation depending on the systematic component in said second path; and carrying out a delay calculation of relative timing paths by using a square root sum of squares of said on-chip variation depending on said systematic component and said on-chip variation depending on said random component.

2. The method according to claim 1, further comprising: specifying said relative timing paths based on circuit data of said integrated circuit; calculating a distance between stages in said specified paths from layout data; and extracting a stage count of each of said specified paths.

3. A method of delay calculation of relative timing paths of an integrated circuit, said method comprising:

calculating an on-chip variation depending on a systematic component and an on-chip variation depending on a random component, wherein said on-chip variation depending on said random component is calculated from a calculation depending on a number of said stages wherein said random component is on presumption of an independent normal distribution and said on-chip variation depending on said random component is calculated from the following equation set (2-1) or (2-2), $$RTR_n = n \cdot \alpha \cdot TP1_1 = VR/\sqrt{n}$$

$$RTR_m = m \cdot \alpha \cdot TP2_1 = VR/\sqrt{m} \qquad (2-1)$$

$$RTR_n = \sqrt{n} \cdot VR$$

$$RTR_m = \sqrt{m} \cdot VR \qquad (2-2)$$

where said relative timing paths contains a first path and a second path, VR is the random component set to each stage in said first path and said second path, $RTS_n$ is said on-chip variation depending on said random component in said first path, $RTS_m$ is said on-chip variation depending on said random component in said second path, α is a constant coefficient, $TP1_1$ is a delay time of a first stage in the first path, $TP2_1$ is a delay time of a first stage in the second path, n is the nth stage in said first path and m is the mth stage in said second path; and carrying out a delay calculation of relative timing paths by using a square root sum of squares of said on-chip variation depending on said systematic component and said on-chip variation depending on said random component.

4. The method according to claim 3, further comprising:

specifying said relative timing paths based on circuit data of said integrated circuit;

calculating a distance between stages in said specified paths from layout data; and extracting a stage count of each of said specified paths.

5. A method of delay calculation of relative timing paths of an integrated circuit, said method comprising:
  calculating an on-chip variation depending on a systematic component and an on-chip variation depending on a random component; and
  carrying out a delay calculation of relative timing paths by using a square root sum of squares of said on-chip variation depending on said systematic component and said on-chip variation depending on said random component and by
  calculating a variation of delay time of each of said relative timing paths from the following equation set (3), using said on-chip variation depending on said systematic component and said on-chip variation depending on said random component, $$TP1_{\min}(L, n) = \sum_{i=1}^{n} \left\{ TP1_i * \left(1 - \sqrt{(RTS_i)^2 + (RTR_i)^2}\right) \right\} \quad (3)$$

$$TP1_{\max}(L, n) = \sum_{i=1}^{n} \left\{ TP1_i * \left(1 + \sqrt{(RTS_i)^2 + (RTR_i)^2}\right) \right\}$$

$$TP2_{\min}(L, m) = \sum_{i=1}^{m} \left\{ TP2_j * \left(1 - \sqrt{(RTS_j)^2 + (RTR_j)^2}\right) \right\}$$

$$TP2_{\max}(L, m) = \sum_{j=1}^{m} \left\{ TP2_j * \left(1 + \sqrt{(RTS_j)^2 + (RTR_j)^2}\right) \right\}$$

where said relative timing paths contains a first path and a second path, $TP1_{max}$ is the maximum delay time of said first path, $TP1_{min}$ are the minimum delay time of said first path, $TP2_{max}$ is the maximum delay time of said second path, $TP2_{min}$ is the minimum delay time of said second path, L is a distance, $TP1_i$ is the ith delay time of said first path, $TP2_j$ is the jth delay time of said second path, n is the nth stage in said first path and m is the mth stage in said second path, RTSi is the ith delay time variation depending on a systematic component, RTRi is the ith delay time variation depending on a random component, RTSj is the jth delay time variation depending on a systematic component and RTRj is the jth delay time variation depending on a random component.

6. The method according to claim 5, further comprising:
  specifying said relative timing paths based on circuit data of said integrated circuit;
  calculating a distance between stages in said specified paths from layout data; and
  extracting a stage count of each of said specified paths.

7. A method of carrying timing analysis of an integrated circuit, comprising:
  carrying out delay calculation of relative timing paths;
  carrying out setup analysis or hold analysis;
  extracting a stage count of each of said specified paths;
  calculating an on-chip variation depending on said random component; and
  correcting said delay time based on said on-chip variation depending on said random component,
  wherein said calculating an on-chip variation depending on said random component comprises:
  calculating said on-chip variation depending on said random component from the following equation set (2-1) or (2-2), $$RTR_n = n \cdot \alpha \cdot TP1_1 = VR/\sqrt{n} \quad (2-1)$$

$$RTR_m = m \cdot \alpha \cdot TP2_1 = VR/\sqrt{m}$$

$$RTR_n = \sqrt{n} \cdot VR$$

$$RTR_m = \sqrt{m} \cdot VR \quad (2-2)$$

where said relative timing paths contains a first path and a second path, VR is the random component set to each stage in said first path and said second path, $RTR_n$ is said on-chip variation depending on said random component in said first path, RTRm is said on-chip variation depending on said random component in said second path, α is a constant coefficient, $TP1_1$ is a delay time of a first stage in said first path, $TP2_1$ is a delay time of a first stage in said second path, n is the nth stage in said first path and m is the mth stage in said second path.

8. A timing analysis system comprising:
  a delay calculation section which calculates a delay time at each of stages in relative timing paths based on circuit data of an integrated circuit;
  a path specifying section which extracts and specifies two of said paths of said integrated circuit;
  a coordinate data extracting section which determines data of coordinates of said specified paths or a distance between said relative timing paths from layout data;
  a stage count extracting section which extracts a number of the stages in each of said specified paths;
  a delay time variation calculating section which calculates a systematic component and a random component of an on-chip variation of the delay time of each of said specified paths, wherein said on-chip variation depending on said systematic component is based on a distance between two stages on said relative timing paths and a delay time of each of said stages and
  said on-chip variation depending on said systematic component is calculated based on the following equation set (1);

$$RTS_n = \sum_{j=1}^{m} TP2_j * VS(L_{p1n-p2j}) \Big/ \sum_{j=1}^{m} TP2_j \quad (1)$$

$$RTS_m = \sum_{i=1}^{n} TP1_i * VS(L_{p2m-p1i}) \Big/ \sum_{i=1}^{n} TP1_i$$

where said relative timing paths contains a first path and a second path, said first path contains n stages, said second path contains m stages, $TP1_n$ is a delay time of the n-th stage in said first path, $TP2_m$ is a delay time of the m-th stage in said second path, $VS(L_{p1n-p2m})$ is the systematic component at the n-th stage in said first path, $L_{p1n-p2m}$ is a distance between the n-th stage in said first path and the m-th stage in said second path, $VS(L_{p2m-p1n})$ is a systematic component of the m-th stage in said second path, $L_{p2m-p1n}$ is a distance between the m-th stage in said second path and the n-th stage in said first path, $RTS_n$ is an on-chip variation depending on the systematic component in said first path, and $RTS_m$ is an on-chip variation depending on the systematic component in said second path; and
  a timing analysis section which carries out timing analysis of SETUP and HOLD based on a square root sum of squares of said on-chip variation depending on said systematic component and said on-chip variation depending on said random component.

9. A timing analysis system comprising:

a delay calculation section which calculates a delay time at each of stages in relative timing paths based on circuit data of an integrated circuit;

a path specifying section which extracts and specifies two of said paths of said integrated circuit;

a coordinate data extracting section which determines data of coordinates of said specified paths or a distance between said relative timing paths from layout data;

a stage count extracting section which extracts a number of the stages in each of said specified paths;

a delay time variation calculating section which calculates a systematic component and a random component of an on-chip variation of the delay time of each of said specified paths, wherein said on-chip variation depending on said random component is calculated from a calculation depending on a number of said stages on presumption of an independent normal distribution and said on-chip variation depending on said random component is calculated from the following equation set (2-1) or (2-2), $RTR_n = n \cdot \alpha \cdot TP1_1 = VR/\sqrt{n}$ $RTR_m = m \cdot \alpha \cdot TP2_1 = VR/\sqrt{m}$ (2-1)

$RTR_n = \sqrt{n} \cdot VR$ $RTR_m = \sqrt{m} \cdot VR$ (2-2)

where said relative timing paths contains a first path and a second path, VR is the random component set to each stage in said first path and said second path, $RTR_n$ is said on-chip variation depending on said random component in said first path, and $RTR_m$ is said on-chip variation depending on said random component in said second path, $\alpha$ is a constant coefficient, $TP1_1$ is a delay time of a first stage in said first path, $TP2_1$ is a delay time of a first stage in said second path, n is the nth stage in said first path and m is the mth stage in said second path; and a timing analysis section which carries out timing analysis of SETUP and HOLD based on a square root sum of squares of said on-chip variation depending on said systematic component and said on-chip variation depending on said random component.

10. A timing analysis system comprising:

a delay calculation section which calculates a delay time at each of stages in relative timing paths based on circuit data of an integrated circuit;

a path specifying section which extracts and specifies two of said paths of said integrated circuit;

a coordinate data extracting section which determines data of coordinates of said specified paths or a distance between said relative timing paths from layout data;

a stage count extracting section which extracts a number of the stages in each of said specified paths;

a delay time variation calculating section which calculates a systematic component and a random component of an on-chip variation of the delay time of each of said specified paths and which calculates a variation of delay time of each of said relative timing paths from the following equation set (3), using said on-chip variation depending on said systematic component and said on-chip variation depending on said random component, $$TP1_{\min}(L, n) = \sum_{i=1}^{n} \left\{ TP1_i * \left(1 - \sqrt{(RTS_i)^2 + (RTR_i)^2}\right) \right\}$$ (3)

$$TP1_{\max}(L, n) = \sum_{i=1}^{n} \left\{ TP1_i * \left(1 + \sqrt{(RTS_i)^2 + (RTR_i)^2}\right) \right\}$$

$$TP2_{\min}(L, m) = \sum_{j=1}^{m} \left\{ TP2_j * \left(1 - \sqrt{(RTS_j)^2 + (RTR_j)^2}\right) \right\}$$

$$TP2_{\max}(L, m) = \sum_{j=1}^{m} \left\{ TP2_j * \left(1 + \sqrt{(RTS_j)^2 + (RTR_j)^2}\right) \right\}$$

where said relative timing paths contains a first path and a second path, $TP1_{max}$ is the maximum delay time of said first path, $TP1_{min}$ are the minimum delay time of said first path, $TP2_{max}$ is the maximum delay time of said second path, $TP2_{min}$ is the minimum delay time of said second path, L is a distance, $TP1_i$ is the ith delay time of said first path, $TP2_j$ is the jth delay time of said second path, n is the nth stage in said first path and m is the mth stage in said second path, RTSi is the ith delay time variation depending on a systematic component, RTRi is the ith delay time variation depending on a random component, RTSj is the jth delay time variation depending on a systematic component and RTRj is the jth delay time variation depending on a random component; and a timing analysis section which carries out timing analysis of SETUP and HOLD based on a square root sum of squares of said on-chip variation depending on said systematic component and said on-chip variation depending on said random component.

11. A timing analysis system comprising:

a delay calculation section which calculates a delay time at each of stages in relative timing paths based on circuit data of an integrated circuit;

a path specifying section which extracts and specifies two of said paths of said integrated circuit;

a stage count extracting section which extracts a number of the stages in each of said specified paths;

a delay time variation calculating section which calculates a random component of an on-chip variation of the delay time of each of said specified paths; and a timing analysis section which carries out timing analysis of SETUP and HOLD based on said on-chip variation depending on said random component, wherein said delay time variation calculating section calculates said on-chip variation depending on said random component from a calculation depending on a number of said stages on presumption of an independent normal distribution, and wherein said delay time variation calculating section calculates said on-chip variation depending on said random component from the following equation set (2-1) or (2-2), $RTR_n = n \cdot \alpha \cdot TP1_1 = VR/\sqrt{n}$ $RTR_m = m \cdot \alpha \cdot TP2_1 = VR/\sqrt{m}$ (2-1)

$RTR_n = \sqrt{n} \cdot VR$ $RTR_m = \sqrt{m} \cdot VR$ (2-2)

where said relative timing paths contains a first path and a second path, VR is the random component set to each stage in said first path and said second path, $RTR_n$ is said on-chip variation depending on said random component in said first path, and $RTR_m$ is said on-chip variation depending on said random component in said second path, α is a constant coefficient, $TP1_1$ is a delay time of a first stage in said first path, $TP2_1$ is a delay time of a first stage in said second path, n is the nth stage in said first path and m is the mth stage in said second path.

12. The timing analysis system according to claim 11, wherein said delay time variation calculating section calculates a variation of delay time of each of said relative timing paths from the following equation set (3), using said on-chip variation depending on said random component, $$TP1_{\min}(L, n) = \sum_{i=1}^{n} \left\{ TP1_i * \left(1 - \sqrt{(RTS_i)^2 + (RTR_i)^2}\right) \right\} \quad (3)$$

$$TP1_{\max}(L, n) = \sum_{i=1}^{n} \left\{ TP1_i * \left(1 + \sqrt{(RTS_i)^2 + (RTR_i)^2}\right) \right\}$$

$$TP2_{\min}(L, m) = \sum_{j=1}^{m} \left\{ TP2_j * \left(1 - \sqrt{(RTS_j)^2 + (RTR_j)^2}\right) \right\}$$

$$TP2_{\max}(L, m) = \sum_{j=1}^{m} \left\{ TP2_j * \left(1 + \sqrt{(RTS_j)^2 + (RTR_j)^2}\right) \right\}$$

where said relative timing paths contains a first path and a second path, TP1 max is the maximum delay time of said first path, $TP1_{min}$ are the minimum delay time of said first path, $TP2_{max}$ is the maximum delay time of said second path, $TP2_{min}$ is the minimum delay time of said second path, L is a distance, $TP1_i$ is the ith delay time of said first path, $TP2_j$ is the jth delay time of said second path, n is the nth stage in said first path and m is the mth stage in said second path, RTSi is the ith delay time variation depending on a systematic component, RTRi is the ith delay time variation depending on a random component, RTSj is the jth delay time variation depending on a systematic component and RTRj is the jth delay time variation depending on a random component.

13. A computer-readable software product for realizing a method of delay calculation of relative timing paths of an integrated circuit, wherein each of said paths contains at least one stage, said method comprising:

calculating an on-chip variation depending on a systematic component;

calculating said on-chip variation depending on a random component; and carrying out delay calculation of relative timing paths by using a square root sum of squares of said on-chip variation depending on said systematic component and said on-chip variation depending on said random component, wherein said on-chip variation depending on said systematic component is based on a distance between two stages on said relative timing paths and a delay time of each of said stages, and carrying out delay calculation of relative timing paths by calculating said on-chip variation depending on said systematic component from the following equation set (1);

$$RTS_n = \sum_{j=1}^{m} TP2_j * VS(L_{p1n-p2j}) \Big/ \sum_{j=1}^{m} TP2_j \quad (1)$$

$$RTS_m = \sum_{i=1}^{n} TP1_i * VS(L_{p2m-p1i}) \Big/ \sum_{i=1}^{n} TP1_i$$

where said relative timing paths contains a first path and a second path, said first path contains n stages, said second path contains m stages, $TP1_n$ is a delay time of the n-th stage in said first path, $TP2_m$ is a delay time of the m-th stage in said second path, $VS(L_{p1n-p2m})$ is the systematic component at the n-th stage in said first path, $L_{p1n-p2m}$ is a distance between the n-th stage in said first path and the m-th stage in said second path, $VS(L_{p2m-p1n})$ is a systematic component of the m-th stage in said second path, $L_{p2m-p1n}$ is a distance between the m-th stage in said second path and the n-th stage in said first path, $RTS_n$ is an on-chip variation depending on the systematic component in said first path, and $RTS_m$ is an on-chip variation depending on the systematic component in said second path.

14. The software product according to claim 13, further comprising:

specifying said relative timing paths based on circuit data of said integrated circuit;

calculating a distance between stages in said specified paths from layout data; and extracting a stage count of each of said specified paths.

15. A computer-readable software product for realizing a method of delay calculation of relative timing paths of an integrated circuit, wherein each of said paths contains at least one stage, said method comprising:

calculating an on-chip variation depending on a systematic component;

calculating said on-chip variation depending on a random component; and carrying out delay calculation of relative timing paths by using a square root sum of squares of said on-chip variation depending on said systematic component and said on-chip variation depending on said random component, wherein said on-chip variation depending on said random component is from a calculation depending on a number of said stages on presumption of an independent normal distribution, and carrying out delay calculation of relative timing paths by calculating said on-chip variation depending on said random component from the following equation set (2-1) or (2-2), $RTR_n = n \cdot \alpha \cdot TP1_1 = VR/\sqrt{n}$ $RTR_m = m \cdot \alpha \cdot TP2_1 = VR/\sqrt{m}$ (2-1)

$RTR_n = \sqrt{n} \cdot VR$ $RTR_m = \sqrt{m} \cdot VR$ (2-2)

where said relative timing paths contains a first path and a second path, VR is the random component set to each stage in said first path and said second path, $RTS_n$ is said on-chip variation depending on said random component in said first path, and $RTS_m$ is said on-chip variation depending on said random component in said second path, α is a constant coefficient, $TP1_1$ is a delay time of a first stage in said first path, TP2₁ is a delay time of a first stage in said second path, n is the nth stage in said first path and m is the mth stage in said second path.

16. The software product according to claim 15, further comprising:

specifying said relative timing paths based on circuit data of said integrated circuit;

calculating a distance between stages in said specified paths from layout data; and extracting a stage count of each of said specified paths.

17. A computer-readable software product for realizing a method of delay calculation of relative timing paths of an integrated circuit, wherein each of said paths contains at least one stage, said method comprising:

calculating an on-chip variation depending on a systematic component;

calculating said on-chip variation depending on a random component; and carrying out delay calculation of relative timing paths by using a square root sum of squares of said on-chip variation depending on said systematic component and said on-chip variation depending on said random component and by calculating a variation of delay time of each of said relative timing paths from the following equation set (3), using said on-chip variation depending on said systematic component and said on-chip variation depending on said random component, $$TP1_{\min}(L, n) = \sum_{i=1}^{n} \left\{ TP1_i * \left(1 - \sqrt{(RTS_i)^2 + (RTR_i)^2}\right) \right\} \quad (3)$$

$$TP1_{\max}(L, n) = \sum_{i=1}^{n} \left\{ TP1_i * \left(1 + \sqrt{(RTS_i)^2 + (RTR_i)^2}\right) \right\}$$

$$TP2_{\min}(L, m) = \sum_{j=1}^{m} \left\{ TP2_j * \left(1 - \sqrt{(RTS_j)^2 + (RTR_j)^2}\right) \right\}$$

$$TP2_{\max}(L, m) = \sum_{j=1}^{m} \left\{ TP2_j * \left(1 + \sqrt{(RTS_j)^2 + (RTR_j)^2}\right) \right\}$$

where said relative timing paths contains a first path and a second path, $TP1_{max}$ is the maximum delay time of said first path, $TP1_{min}$ are the minimum delay time of said first path, TP2 max is the maximum delay time of said second path, $TP2_{min}$ is the minimum delay time of said second path L is a distance, $TP1_i$ is the ith delay time of said first path, $TP2_j$ is the jth delay time of said second path, n is the nth stage in said first path and m is the mth stage in said second path, RTSi is the ith delay time variation depending on a systematic component, RTRi is the ith delay time variation depending on a random component, RTSj is the jth delay time variation depending on a systematic component and RTRj is the jth delay time variation depending on a random component.

18. The software product according to claim 17, further comprising:

specifying said relative timing paths based on circuit data of said integrated circuit;

calculating a distance between stages in said specified paths from layout data; and extracting a stage count of each of said specified paths.

19. A method of designing an integrated circuit, said method comprising:

preparing a circuit design data of said integrated circuit;

preparing a layout design data of said integrated circuit;

calculating an on-chip variation depending on a systematic component based on said layout design data, wherein said on-chip variation depending on said systematic component is based on a distance between two stages on said relative timing paths and a delay time of each of said stages and said on-chip variation depending on said systematic component is calculated from the following equation set (1);

$$RTS_n = \sum_{j=1}^{m} TP2_j * VS(L_{p1n-p2j}) \Big/ \sum_{j=1}^{m} TP2_j \quad (1)$$

$$RTS_m = \sum_{i=1}^{n} TP1_i * VS(L_{p2m-p1i}) \Big/ \sum_{i=1}^{n} TP1_i$$

where said relative timing paths contains a first path and a second path, said first path contains n stages, said second path contains m stages, $TP1_n$ is a delay time of the n-th stage in said first path, $TP2_m$ is a delay time of the m-th stage in said second path, $VS(L_{p1n-p2m})$ is the systematic component at the n-th stage in said first path, $L_{p1n-p2m}$ is a distance between the n-th stage in said first path and the m-th stage in said second path, $VS(L_{p2m-p1n})$ is a systematic component of the m-th stage in said second path, $L_{p2m-p1n}$ is a distance between the m-th stage in said second path and the n-th stage in said first path, $RTS_n$ is an on-chip variation depending on the systematic component in said first path, and $RTS_m$ is an on-chip variation depending on the systematic component in said second path;

calculating an on-chip variation depending on a random component based on said circuit design data; and carrying out a delay calculation of relative timing paths by using a square root sum of squares of said on-chip variation depending on said systematic component and said on-chip variation depending on said random component.

20. A method of manufacturing an integrated circuit, said method comprising:

preparing a circuit design data and layout design data of said integrated circuit;

executing a delay calculation of relative timing paths of said integrated circuit;

manufacturing said integrated circuit based on said delay calculation of relative timing paths, wherein said delay calculation of relative timing paths comprises;

calculating an on-chip variation depending on a systematic component based on said layout design data, wherein said on-chip variation depending on said systematic component is based on a distance between two stages on said relative timing paths and a delay time of each of said stages and said on-chip variation depending on said systematic component is calculated from the following equation set (1);

$$RTS_n = \sum_{j=1}^{m} TP2_j * VS(L_{p1n-p2j}) \bigg/ \sum_{j=1}^{m} TP2_j \quad (1)$$

$$RTS_m = \sum_{i=1}^{n} TP1_i * VS(L_{p2m-p1i}) \bigg/ \sum_{i=1}^{n} TP1_i$$

where said relative timing paths contains a first path and a second path, said first path contains n stages, said second path contains m stages, $TP1_n$ is a delay time of the n-th stage in said first path, $TP2_m$ is a delay time of the m-th stage in said second path, $VS(L_{p1n-p2m})$ is the systematic component at the n-th stage in said first path, $L_{p1n-p2m}$ is a distance between the n-th stage in said first path and the m-th stage in said second path, $VS(L_{p2m-p1n})$ is a systematic component of the m-th stage in said second path, $L_{p2m-p1n}$ is a distance between the m-th stage in said second path and the n-th stage in said first path, $RTS_n$ is an on-chip variation depending on the systematic component in said first path, and $RTS_m$ is an on-chip variation depending on the systematic component in said second path; and carrying out a delay calculation of relative timing paths by using a square root sum of squares of said on-chip variation depending on said systematic component and an on-chip variation depending on a random component.

21. A method of designing an integrated circuit, said method comprising:

preparing a circuit design data of said integrated circuit;

preparing a layout design data of said integrated circuit;

calculating an on-chip variation depending on a systematic component based on said layout design data;

calculating an on-chip variation depending on a random component based on said circuit design data, wherein said on-chip variation depending on said random component is calculated from a calculation depending on a number of said stages wherein said random component is on presumption of an independent normal distribution and said on-chip variation depending on said random component is calculated from the following equation set (2-1) or (2-2), $$RTR_n = n \cdot \alpha \cdot TP1_1 = VR/\sqrt{n}$$

$$RTR_m = m \cdot \alpha \cdot TP2_1 = VR/\sqrt{m} \quad (2\text{-}1)$$

$$RTR_n = \sqrt{n} \cdot VR$$

$$RTR_m = \sqrt{m} \cdot VR \quad (2\text{-}2)$$

where said relative timing paths contains a first path and a second path, VR is the random component set to each stage in said first path and said second path, $RTS_n$ is said on-chip variation depending on said random component in said first path, $RTS_m$ is said on-chip variation depending on said random component in said second path, α is a constant coefficient, $TP1_1$ is a delay time of a first stage in the first path, $TP2_1$ is a delay time of a first stage in the second path, n is the nth stage in said first path and m is the mth stage in said second path; and carrying out a delay calculation of relative timing paths by using a square root sum of squares of said on-chip variation depending on said systematic component and said on-chip variation depending on said random component.

22. A method of designing an integrated circuit, said method comprising:

preparing a circuit design data of said integrated circuit;

preparing a layout design data of said integrated circuit;

calculating an on-chip variation depending on a systematic component based on said layout design data;

calculating an on-chip variation depending on a random component based on said circuit design data; and carrying out a delay calculation of relative timing paths by using a square root sum of squares of said on-chip variation depending on said systematic component and said on-chip variation depending on said random component and by calculating a variation of delay time of each of said relative timing paths from the following equation set (3), using said on-chip variation depending on said systematic component and said on-chip variation depending on said random component, $$TP1_{\min}(L, n) = \sum_{i=1}^{n} \left\{ TP1_i * \left(1 - \sqrt{(RTS_i)^2 + (RTR_i)^2}\right) \right\} \quad (3)$$

$$TP1_{\max}(L, n) = \sum_{i=1}^{n} \left\{ TP1_i * \left(1 + \sqrt{(RTS_i)^2 + (RTR_i)^2}\right) \right\}$$

$$TP2_{\min}(L, m) = \sum_{i=1}^{m} \left\{ TP2_j * \left(1 - \sqrt{(RTS_j)^2 + (RTR_j)^2}\right) \right\}$$

$$TP2_{\max}(L, m) = \sum_{j=1}^{m} \left\{ TP2_j * \left(1 + \sqrt{(RTS_j)^2 + (RTR_j)^2}\right) \right\}$$

where said relative timing paths contains a first path and a second path, $TP1_{max}$ is the maximum delay time of said first path, $TP1_{min}$ are the minimum delay time of said first path, $TP2_{max}$ is the maximum delay time of said second path, $TP2_{min}$ is the minimum delay time of said second path, L is a distance, $TP1_i$ is the ith delay time of said first path, $TP2_j$ is the jth delay time of said second path, n is the nth stage in said first path and m is the mth stage in said second path, RTSi is the ith delay time variation depending on a systematic component, RTRi is the ith delay time variation depending on a random component, RTSj is the jth delay time variation depending on a systematic component and RTRj is the jth delay time variation depending on a random component.

23. A method of manufacturing an integrated circuit, said method comprising:

preparing a circuit design data and layout design data of said integrated circuit;

executing a delay calculation of relative timing paths of said integrated circuit;

manufacturing said integrated circuit based on said delay calculation of relative timing paths, wherein said delay calculation of relative timing paths comprises;

calculating an on-chip variation depending on a systematic component based on said layout design data;

calculating an on-chip variation depending on a random component based on said circuit design data, wherein said on-chip variation depending on said random component is calculated from a calculation depending on a number of said stages wherein said random component is on presumption of an independent normal distribution and said on-chip variation depending on said random component is calculated from the following equation set (2-1) or (2-2), $$RTR_n = n \cdot \alpha \cdot TP1_1 = VR/\sqrt{n}$$
$$RTR_m = m \cdot \alpha \cdot TP2_1 = VR/\sqrt{m} \quad (2\text{-}1)$$

$$RTR_n = \sqrt{n} \cdot VR$$
$$RTR_m = \sqrt{m} \cdot VR \quad (2\text{-}2)$$

where said relative timing paths contains a first path and a second path, VR is the random component set to each stage in said first path and said second path, $RTS_n$ is said on-chip variation depending on said random component in said first path, $RTS_m$ is said on-chip variation depending on said random component in said second path, $\alpha$ is a constant coefficient, $TP1_1$ is a delay time of a first stage in the first path, $TP2_1$ is a delay time of a first stage in the second path, n is the nth stage in said first path and m is the mth stage in said second path; and carrying out a delay calculation of relative timing paths by using a square root sum of squares of said on-chip variation depending on said systematic component and said on-chip variation depending on said random component.

24. A method of manufacturing an integrated circuit, said method comprising:

preparing a circuit design data and layout design data of said integrated circuit;

executing a delay calculation of relative timing paths of said integrated circuit;

manufacturing said integrated circuit based on said delay calculation of relative timing paths, wherein said delay calculation of relative timing paths comprises;

calculating an on-chip variation depending on a systematic component based on said layout design data;

calculating an on-chip variation depending on a random component based on said circuit design data; and carrying out a delay calculation of relative timing paths by using a square root sum of squares of said on-chip variation depending on said systematic component and said on-chip variation depending on said random component and by calculating a variation of delay time of each of said relative timing paths from the following equation set (3), using said on-chip variation depending on said systematic component and said on-chip variation depending on said random component, $$TP1_{\min}(L, n) = \sum_{i=1}^{n} \left\{ TP1_i * \left(1 - \sqrt{(RTS_i)^2 + (RTR_i)^2}\right)\right\} \quad (3)$$

$$TP1_{\max}(L, n) = \sum_{i=1}^{n} \left\{ TP1_i * \left(1 + \sqrt{(RTS_i)^2 + (RTR_i)^2}\right)\right\}$$

$$TP2_{\min}(L, m) = \sum_{j=1}^{m} \left\{ TP2_j * \left(1 - \sqrt{(RTS_j)^2 + (RTR_j)^2}\right)\right\}$$

$$TP2_{\max}(L, m) = \sum_{j=1}^{m} \left\{ TP2_j * \left(1 + \sqrt{(RTS_j)^2 + (RTR_j)^2}\right)\right\}$$

where said relative timing paths contains a first path and a second path, $TP1_{max}$ is the maximum delay time of said first path, $TP1_{min}$ are the minimum delay time of said first path, $TP2_{max}$ is the maximum delay time of said second path, $TP2_{min}$ is the minimum delay time of said second path, L is a distance, $TP1_i$ is the ith delay time of said first path, $TP2_j$ is the jth delay time of said second path, n is the nth stage in said first path and m is the mth stage in said second path, RTSi is the ith delay time variation depending on a systematic component, RTRI is the ith delay time variation depending on a random component, RTSj is the jth delay time variation depending on a systematic component and RTRj is the jth delay time variation depending on a random component.

* * * * *